(12) United States Patent
Mangano et al.

(10) Patent No.: US 10,852,451 B2
(45) Date of Patent: Dec. 1, 2020

(54) SYSTEM FOR INTERFACING AN LC SENSOR, RELATED METHOD AND COMPUTER PROGRAM PRODUCT

(71) Applicant: STMicroelectronics S.r.l., Agrate Brianza (IT)

(72) Inventors: Daniele Mangano, San Gregorio di Catania (IT); Riccardo Condorelli, Tremestieri Etneo / Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 49 days.

(21) Appl. No.: 16/197,673

(22) Filed: Nov. 21, 2018

(65) Prior Publication Data

US 2019/0107640 A1 Apr. 11, 2019

Related U.S. Application Data

(63) Continuation of application No. 14/835,935, filed on Aug. 26, 2015, now Pat. No. 10,168,443.

(30) Foreign Application Priority Data

Nov. 17, 2014 (IT) ............................... T02014A0951

(51) Int. Cl.
*G01V 3/10* (2006.01)
*H03K 17/95* (2006.01)

(52) U.S. Cl.
CPC .......... *G01V 3/10* (2013.01); *H03K 17/9525* (2013.01)

(58) Field of Classification Search
CPC ............................ G01V 3/10; H03K 17/9525
See application file for complete search history.

(56) References Cited

U.S. PATENT DOCUMENTS

| 4,560,923 | A |   | 12/1985 | Hanson |              |
|-----------|---|---|---------|--------|--------------|
| 4,652,821 | A | * | 3/1987  | Kreft  | G01D 3/10    |
|           |   |   |         |        | 324/207.13   |
| 5,153,525 | A | * | 10/1992 | Hoekman| G08G 1/042   |
|           |   |   |         |        | 324/207.16   |
| 5,158,166 | A | * | 10/1992 | Barson | G07D 5/08    |
|           |   |   |         |        | 194/317      |
| 5,180,046 | A | * | 1/1993  | Hutton | G07D 5/02    |
|           |   |   |         |        | 194/319      |

(Continued)

FOREIGN PATENT DOCUMENTS

| CN | 1520329   A | 8/2004  |
|----|-------------|---------|
| CN | 103438911 A | 12/2013 |

(Continued)

OTHER PUBLICATIONS

Analog Devices Wili, Chapter 7: Diode application topics, 2013.

(Continued)

*Primary Examiner* — Daniel R Miller
(74) *Attorney, Agent, or Firm* — Slater Matsil, LLP

(57) ABSTRACT

A system for interfacing an LC sensor includes a starter configured to selectively start an oscillation of the LC sensor. The system also includes an analog peak detector configured to determine a signal being indicative of a peak voltage of the oscillation of the LC sensor and a detector configured to determine a state of the LC sensor as a function of the signal determined by the analog peak detector.

20 Claims, 14 Drawing Sheets

(56) References Cited

U.S. PATENT DOCUMENTS

| | | |
|---|---|---|
| 5,278,512 A | 1/1994 | Goldstein |
| 5,589,778 A | 12/1996 | Ono et al. |
| 2002/0079908 A1 | 6/2002 | Hohl |
| 2005/0134234 A1 | 6/2005 | Kaiser |
| 2010/0225332 A1 | 9/2010 | Niwa et al. |
| 2010/0320066 A1* | 12/2010 | Rosenau .............. G01D 11/245 200/345 |
| 2010/0321096 A1 | 12/2010 | Sudjian |
| 2013/0314077 A1 | 11/2013 | Okada et al. |
| 2016/0139287 A1 | 5/2016 | Mangano et al. |

FOREIGN PATENT DOCUMENTS

| | | |
|---|---|---|
| CN | 205749933 U | 11/2016 |
| DE | 102009045460 B3 | 2/2011 |
| EP | 0227589 A2 | 7/1987 |
| EP | 0408084 A1 | 1/1991 |
| EP | 1538516 A2 | 6/2005 |
| EP | 2747283 A1 | 6/2014 |
| WO | 9942789 A1 | 8/1999 |

OTHER PUBLICATIONS

Hernitscheck, "Rotation Detection with the MSP430 Scan Interface", Application Report SLAA222A, Nov. 20, pp. 1-26, Texas Instruments, Dallas, TX, Available at http://www.ti.com//lit/an/slaa222a/slaa222a.pdf.

Silicon Labs, "Low Energy Sensor AN0029—Application Note", Sep. 16, 2013, pp. 1-23, Austin, TX, Availble at https://www.silabs.com/Support%20Dcouments/TechnicalDocs/AN0029.pdf.

Silicon Labs, "Lizard Labs Lesense Presentation", Oct. 2, 2013, pp. 19, Austin, TX. Available at https://www.silabs.com/Marcom%20Documents/Training%20Documents/lizard-labs-lesense-presentation.pdf.

Texas Instruments, "MSP430x4xx Family Users Gudie" Apr. 2013, Chapter 32, 33. 887-938, Texas Instruments, Dallas. TX. Available at http://www.ti.com.lit.com.lit/ug/slau0561/slau00561.pdf.

* cited by examiner

SYSTEM FOR INTERFACING AN LC SENSOR, RELATED METHOD AND COMPUTER PROGRAM PRODUCT

CROSS-REFERENCE TO RELATED APPLICATIONS

This application is a continuation of U.S. application Ser. No. 14/835,935, filed on Aug. 26, 2015, which claims priority to Italian Application No. TO2014A000951, filed on Nov. 17, 2014, which applications are hereby incorporated herein by reference.

TECHNICAL FIELD

Embodiments of the present disclosure relate to interfacing an LC sensor.

BACKGROUND

LC sensors are well known in the art. For example, LC sensors may be used as electronic proximity sensors which are able to detect the presence of a conductive target. Some common applications of inductive sensors include, e.g., metal detectors and derived applications, such as rotation sensors.

FIG. 1 shows a typical LC sensor 10. Specifically, in FIG. 1, the LC sensor 10 comprises an inductor L and a capacitor C, which form a resonant circuit also called a tank circuit. The arrangement comprises a power supply 102, such as a voltage source, and a switch 104.

When the switch 104 is in a first position as shown in FIG. 1, the capacitor C is charged up to the supply voltage. When the capacitor C is fully charged, the switch 104 changes position and places the capacitor C in parallel with the inductor L and starts to discharge through the inductor L and initiates an oscillation between the LC resonant circuit 10.

From a practical point of view, the LC sensor 10 also comprises resistive components R, which will dissipate energy over time. Accordingly, losses occur which will decay the oscillations, i.e. the oscillation is damped.

Basically, such LC sensors 10 may be used, e.g., to detect metallic objects, because the oscillation may be damped quicker in the presence of a metallic object (see e.g., FIG. 2b) compared to an oscillation without a metallic object (see e.g., FIG. 2a).

Generally, the sensing component of an LC sensor 10 may be the inductor L, the capacitor C and/or the resistor R. For example, the resistance R influences primarily the damping factor, while the L and C components influence primarily the oscillation frequency.

Moreover, an LC sensor 10 may also be created by coupling a capacitor C to an inductive sensor L or an inductor L to a capacitive sensor C. However, usually the inductor L (with its dissipative losses) constitutes the sensing element.

FIG. 3a shows a possible example for performing the LC sensing of the sensor 10 with a control unit 20a, such as a microcontroller described in the documents Application Note AN0029, "Low Energy Sensor Interface-Inductive Sensing", Rev. 1.05, 2013 May 9, Energy micro, or Application Report SLAA222A, "Rotation Detection with the MSP430 Scan Interface", April 2011, Texas Instruments.

In the example considered, the control unit 20a comprises two pins or pads 202a and 204a, and the LC sensor 10 is coupled between these pins 202a and 204a.

Substantially, the control unit 20a comprises a controllable voltage source 206a coupled to the pin 202a in order to impose a fixed voltage $V_{MID}$ at this pin 202a. For example, usually a digital-to-analog converter (DAC) or a dedicated voltage source is used for this purpose.

During a charge phase, the pin 204a is coupled to ground GND. Accordingly, during this phase, the sensor 10 is coupled between the voltage $V_{MID}$ and ground GND and the capacitor C of the sensor 10 is charged to the voltage $V_{MID}$.

Next, the control unit 20a opens the second pin 204a, i.e. the pin 204a is floating. Accordingly, due to the fact that the capacitor C of the sensor 10 has been charged during the previous phase, the LC resonant circuit 10 starts to oscillate as previously described.

Thus, by analyzing the voltage, e.g. voltage $V_{204}$ at pin 204a, the oscillation may be characterized. In particular, as shown in FIG. 3b, the voltage at the pin 204a corresponds to a damped oscillation having a DC offset corresponding to the voltage $V_{MID}$, imposed by the voltage source 206a, i.e. the voltage $V_{MID}$ constitutes the middle point of the oscillation.

Accordingly, the voltage $V_{MID}$ is usually set to half of the supply voltage of the control unit 20a, e.g. VDD/2, in order to have the maximum range.

Often, the circuit also comprises an additional capacitor C1 coupled between the pin 202a and ground GND in order to stabilize the voltage signal $V_{MID}$ and to provide the boost of current required to charge the sensor.

In order to analyze the signal at the pin 204a (see e.g. FIG. 3a), the control unit 20a may comprise an analog-to-digital converter (ADC) 208a coupled to the pin 204a in order to sample the voltage of the oscillation. Thus, based on the resolution and sampling frequency of the ADC 208a, the whole oscillation may be characterized.

FIG. 4 shows an alternative approach. Specifically, the control unit 20a comprises a comparator 210a, which compares the voltage at the pin 204a with a reference signal, such as a reference voltage $V_{Ref}$. For example, this reference voltage $V_{Ref}$ may be fixed, e.g. fixed to a voltage being slightly greater than VDD/2, or set via a digital-to-analog converter 212a.

For example, FIGS. 5a and 5b show respectively the oscillations with and without a metallic object in the vicinity of the sensor 10. The reference voltage $V_{Ref}$ and the output CMP of the comparator 210a is also shown in FIGS. 5a and 5b.

Generally, the two approaches shown in FIGS. 3a and 4, i.e. the ADC 208a and comparator 210a, may also be combined in the same control unit 20a.

Thus, based on the foregoing, contactless motion measurement may be achieved by interfacing LC sensors directly with microcontroller integrated circuits (ICs). Such sensing may be useful, e.g., for metering systems (gas, water, distance, etc.).

However, while handling and sampling sensors, microcontrollers (or MCUs) should reduce as much as possible the power consumption in order to permit the development of battery-powered systems.

Moreover, as MCU units are typically general-purpose, there is also the need to reduce as much as possible the silicon area due to the specialized circuits required for the implementation of the above functionality.

Accordingly, in LC sensor excitation and measurement techniques it is important to reduce consumption and cost, especially for battery powered applications as already mentioned.

For example, the measurement procedure applied in known approaches have a typical measurement time of around 50 µs, in which the excitation part, e.g. the generator of the voltage $V_{MID}$, and the measurement part, e.g. the comparator or analog-to-digital converter, have to be switched on.

Thus, a first problem is related to the use of dedicated low power analog components for generating the voltage $V_{MID}$ and the internal reference voltage $V_{Ref}$, which results in a greater cost.

A second problem is related to the digital-to-analog converter 210a that has to be both low power and fast enough to follow the damped oscillation. This leads to significant power consumption per measurement and challenging application constraints in battery-powered systems.

Another critical aspect is that, depending on the specific sensor sizes to be supported, there could be the need to detect high frequency oscillations. Thus, in order to have enough flexibility to support a wide range of sensor sizes, a fast (and thus power consuming) comparator or analog-to-digital converter is required.

SUMMARY

On the basis of the foregoing description, the need is felt for approaches which overcome one or more of previously outlined drawbacks.

According to one or more embodiments, such an object is achieved through a system having the features specifically set forth in the claims that follow. Embodiments moreover concerns a related method, as well as a corresponding related computer program product, loadable in the memory of at least one computer and including software code portions for performing the steps of the method when the product is run on a computer. As used herein, reference to such a computer program product is intended to be equivalent to reference to a computer-readable medium containing instructions for controlling a computer system to coordinate the performance of the method. Reference to "at least one computer" is evidently intended to highlight the possibility for the present disclosure to be implemented in a distributed/modular fashion.

As mentioned in the foregoing, the present description provides approaches for interfacing a LC sensor with a control unit, such as a microcontroller.

In various embodiments, the arrangement comprises a starter configured to selectively start an oscillation of the LC sensor. For example, as disclosed in the foregoing, the LC sensor may be coupled to a middle-point voltage generator and a switch configured to connect the other terminal selectively to ground.

In another embodiment, an analog peak detector is used in order to determine a signal being indicative of a peak voltage of the oscillation of the LC sensor. For this reason, one of the terminals of the LC sensor may be coupled to this peak detector.

For example, a peak detector may be implemented by at least one diode and at least one storage capacitor. For example, the peak detector may comprise a diode and a storage capacitor, wherein the anode of the diode may be coupled to the LC sensor and the cathode of said diode is coupled to a first terminal of the storage capacitor, and where the second terminal of the storage capacitor is coupled to ground. In this case, the voltage at the storage capacitor provides the peak value of the oscillation of the LC sensor.

In another embodiment, the peak detector comprises a capacitive voltage divider, such that the above peak signal corresponds to a scaled down version of the peak voltage of the oscillation of the LC sensor.

In another embodiment, the peak detector has at least one electronic switch, configured to selectively discharge the at least one storage capacitor as a function of a control signal provided, e.g., by the control unit.

In another embodiment, the peak detector comprises at least one electronic switch, configured to selectively enable or disable the peak detector as a function of a control signal provided, e.g., by the control unit. For example, the peak detector may have a control circuit configured to enable the peak detector as a function of the voltage of the oscillation of the LC sensor.

In another embodiment, the signal provided by the peak detector is fed to a detector configured to determine the state of said LC sensor. For example, the detector may comprise an analog-to-digital converter and/or an analog comparator.

Generally, at least the starter and the detector may be incorporated in the control unit, such as an integrated circuit.

The approaches described in the present disclosure are also suitable for interfacing multiple LC sensors. For this reason, one or more starters may be used to start the oscillations of the LC sensors.

In this case, each LC sensor may be coupled to a respective analog peak detector configured to determine a signal being indicative of the peak voltage of the oscillation of the respective LC sensor.

The signals provided by the peak detectors are fed to a detector configured to determine the states of the LC sensors. However, due to the fact that the peak values are stored, the analog peak detectors may provide the peak signals to the same analog-to-digital converter or the same analog comparator.

Accordingly, in some embodiments, the control unit may drive the starter in order to start the oscillation of an LC sensor. The control unit may obtain the signal being indicative of a peak voltage of the oscillation of the LC sensor from the analog peak detector and detect the state of the LC sensor from the detector.

The approaches described herein are particularly useful for low-power applications because the control unit may deactivate the starter once the peak detector has determined the peak voltage of the oscillation of the LC sensor. Furthermore, the detector may only be activated once the peak detector has determined the peak voltage of the oscillation of said LC sensor. For example, the starter may be deactivated and/or the detector enabled more or less contemporaneously, e.g., once a given period of time has lapsed. However, the oscillation of the LC sensor may also be analyzed in order to determine when the starter may be deactivated and/or the detector enabled.

BRIEF DESCRIPTION OF THE DRAWINGS

Embodiments of the invention will now be described with reference to the annexed drawings, which are provided purely by way of non-limiting example and in which:

FIG. 3b shows the damped oscillation of the LC sensor of FIG. 3a;

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" indicates that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

In the following FIGS. 6 to 18 parts, elements or components which have already been described with reference to FIGS. 1 to 5 are denoted by the same references previously used in such Figures. The description of such previously described elements will not be repeated in the following in order to not overburden the present detailed description.

The embodiments described offer approaches that permit an efficient handling of at least one LC sensor 10 by reducing the required dedicated on-chip components and/or by ensuring reduced power consumption.

Specifically, as mentioned in the foregoing, fast comparators or analog-to-digital converters are usually required to analyze the oscillation of an LC sensor.

In order to avoid this problem, a peak detector is used to detect a value being indicative of the maximum peak value of the oscillation.

Figure 6A:
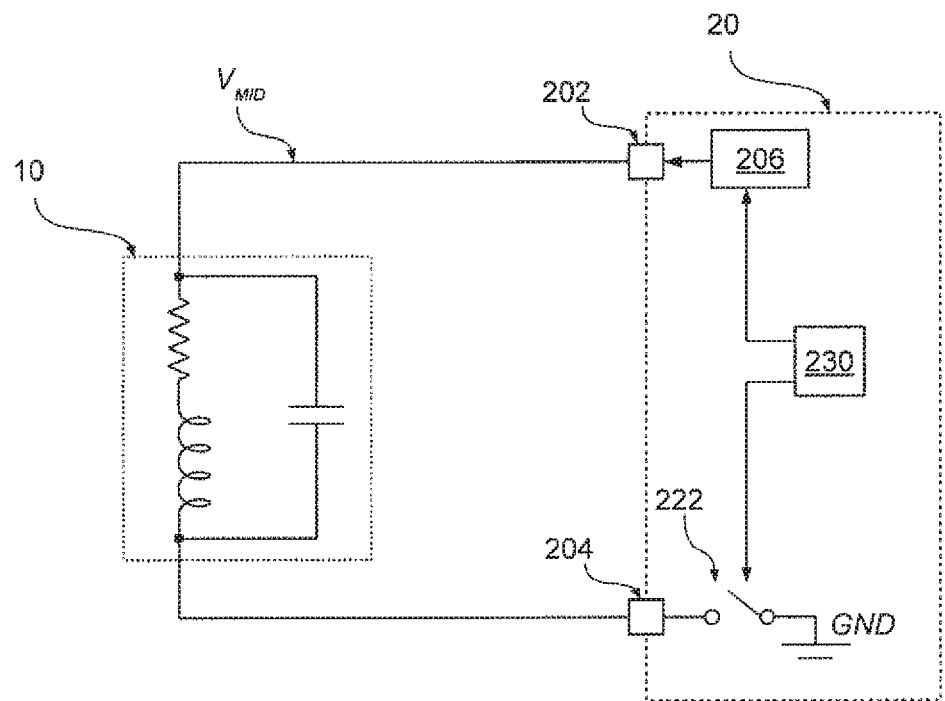
FIGS. 6a, 6b and 10 show embodiments of the invention for starting the oscillation of an LC sensor.
Figure 6B:
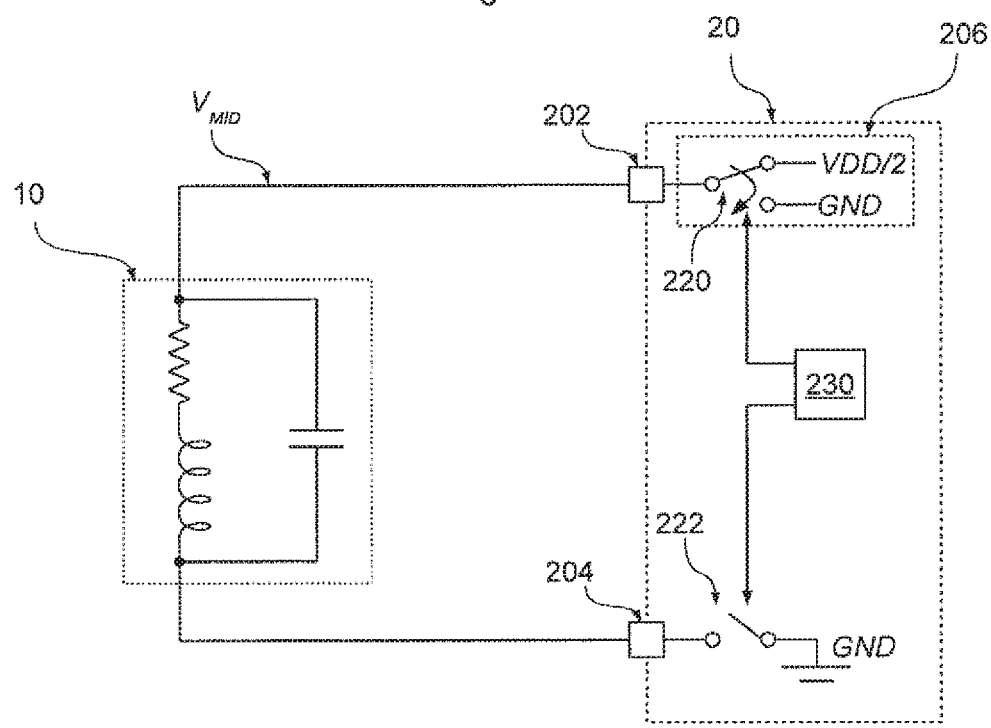

For example, FIGS. 6a and 6b show embodiments, which are based on an excitation approach. Specifically, the LC sensor 10 is coupled (e.g. directly) between pins 202 and 204 of a control unit 20, such as a microcontroller. The control unit 20 comprises a voltage source 206 coupled to the pin 202 in order to impose a fixed voltage $V_{MID}$ at this pin 202. For example, a controllable voltage source 206, such as a digital-to-analog converter (DAC), may be used for this purpose.

Conversely, as shown e.g. in FIG. 6b, such a voltage source 206 may not also comprise a controllable voltage source for generating the voltage $V_{MID}$, but the voltage source 206 may be implemented by a switch 220 configured to connect the pin 202 selectively to a fixed voltage or ground GND. Since the voltage $V_{MID}$ represents the middle point voltage of the oscillation, this fixed voltage preferably corresponds at most to half of the supply voltage VDD of the control unit 20, i.e. VDD/2, and may be provided by an internal voltage reference generator being often available in conventional microcontrollers. Generally, the supply voltage VDD may be received via a power supply pin of the control unit 20. Accordingly, in this embodiment, the pin 202 may be either coupled to ground GND or coupled to a given fixed voltage signal.

The control unit 20 comprises a further switch 222 configured to connect the pin 204 selectively to ground GND. Thus, generally, the operation of the voltage generator 206 and the switch 222 could also be implemented with the pin driver circuitry of a conventional microcontroller.

Figure 10:
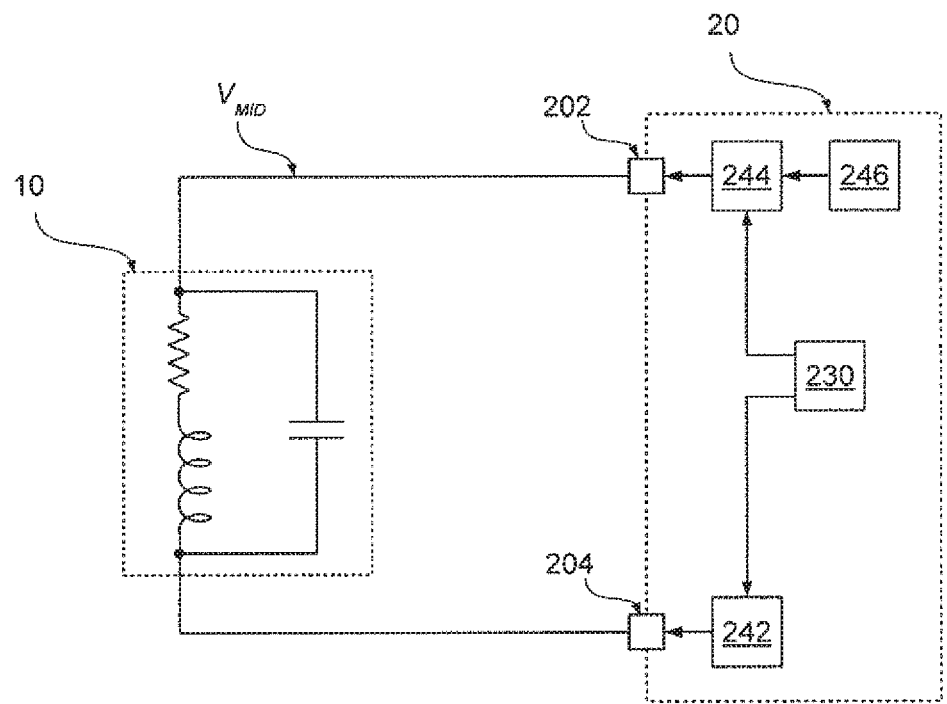

For example, as shown in FIG. 10, the voltage generator 206 may be implemented with a conventional crossbar switch 244, which connects the pin 202 to a reference voltage source 246 integrated within the control unit 20. Conversely, the switch 222 may be implemented with a three state output driver logic 242 of a conventional microcontroller.

The switching of the switches 220 and 222 is controlled by a processing unit 230, such as a digital processing unit programmed via software instructions, such as the central processing unit (CPU) of a microcontroller, or a dedicated digital IP. Accordingly, when the oscillation of the LC sensor 10 has to be started, a fixed voltage $V_{MID}$ corresponding to VDD/2, for example, is supplied at the pin 202 via the voltage generator 206 and the pin 204 is coupled via the switch 222 for a short period of time to ground GND.

In the embodiment shown in FIG. 6b, the processing unit may connect the fixed voltage to the pin 202 and close the switch 222, thereby connecting the pin 204 to ground GND. Thus, during a charge phase, the pin 204 is coupled to ground GND, and the sensor 10 is coupled between the voltage $V_{MID}$ and ground GND, thereby charging the sensor 10 to the voltage $V_{MID}$. Next, while the excitation pin 202 remains coupled to the fixed voltage, the control unit 20 opens the switch 222, i.e. the pin 204 is now floating. Accordingly, due to the fact that the sensor 10 has been charged during the previous phase, the LC resonant circuit 10 starts to oscillate as described previously.

Figure 7A:
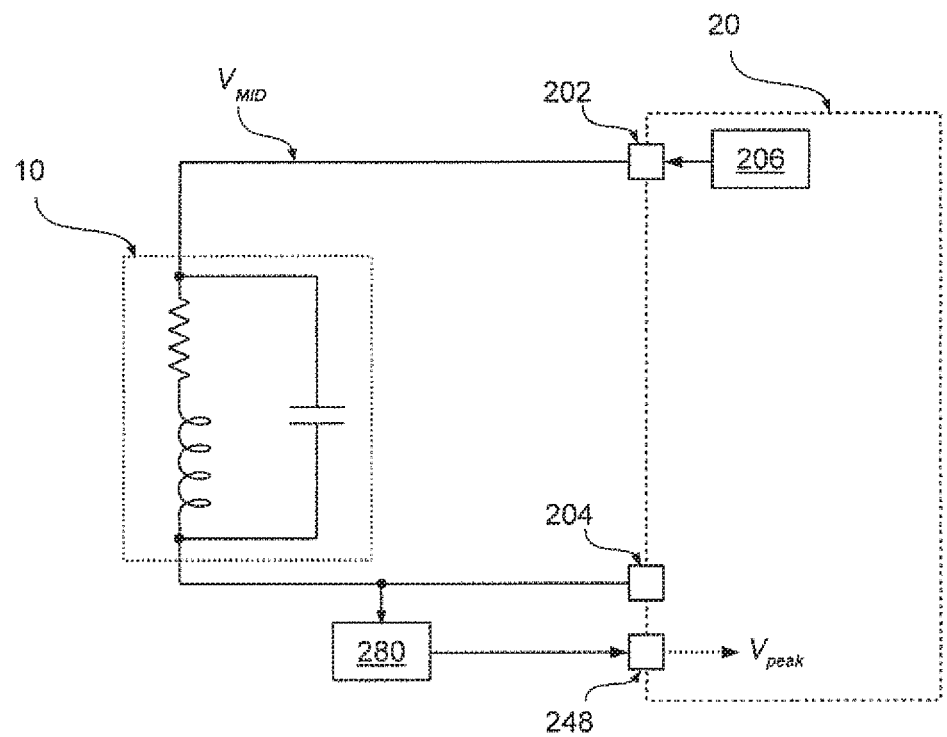
FIGS. 7a and 7b show embodiments of the invention for interfacing an LC sensor by a peak detector.
Figure 7B:
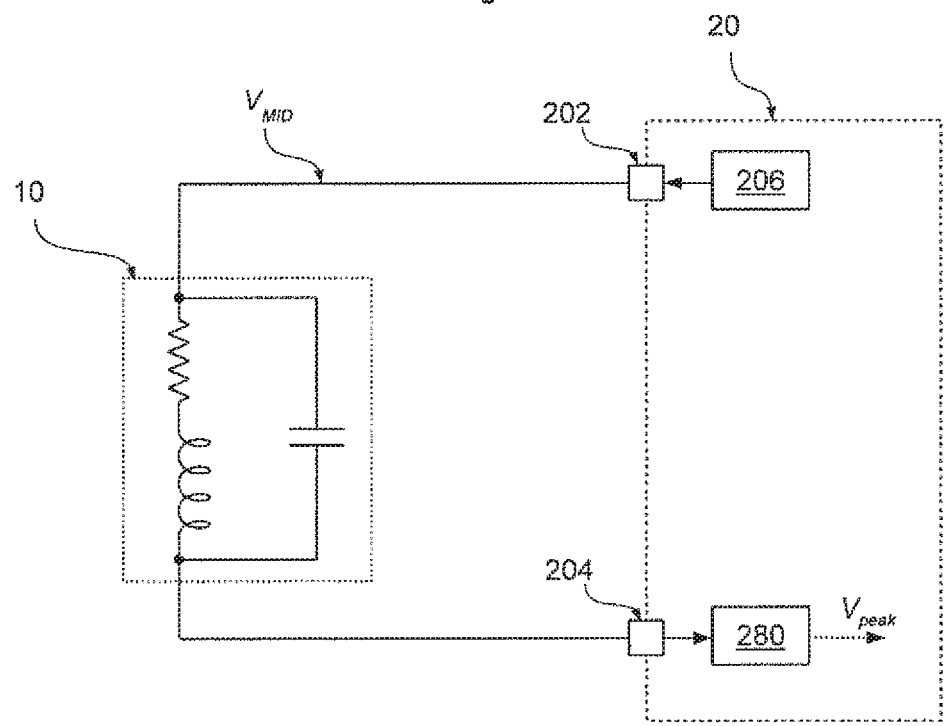

In various embodiments, the voltage at the pin 204 is fed to a peak detector 280. For example, FIG. 7a shows an embodiment wherein the peak detector 280 is external to the control unit 20, while FIG. 7b shows an embodiment wherein the peak detector 280 is integrated in the control unit 20. Those of skill in the art will appreciate that for illustration purposes some of the components already described in the foregoing may not be shown in FIGS. 7a and 7b, such as the switch 222.

Specifically, in case an external peak detector 280 is used (see FIG. 7a), the output of the peak detector 280 may be fed to an additional pin 248 of the control unit 20 in order to permit a processing of the peak value by the control unit 20.

Figure 8A:
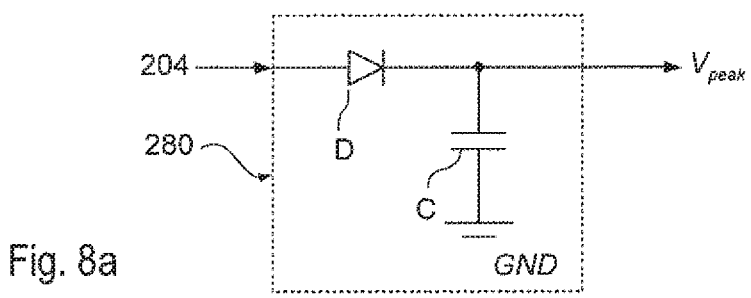
FIGS. 8a to 8e show embodiments of peak detectors.

FIG. 8a shows a first embodiment of a peak detector 280. The peak detector 280 comprises a diode D and a storage capacitor C. Specifically, the anode of the diode D is coupled (e.g. directly) to the pin 204 and the cathode of the diode D is coupled (e.g. directly) to a first terminal of the capacitor C. Conversely, the second terminal of the capacitor C is coupled (e.g. directly) to ground GND.

Accordingly, once the oscillation of the LC sensor has been started the output of the peak detector 280 will provide a signal $V_{peak}$ being indicative of the peak voltage of the oscillation at the pin 204. For example, neglecting the forward voltage of the diode D, the capacitor C will be charged to a voltage which corresponds to the peak voltage of the oscillation at the pin 204. Thus, the voltage $V_{peak}$ at the capacitor C is indicative of the peak voltage of the oscillation at the pin 204.

Figure 8B:
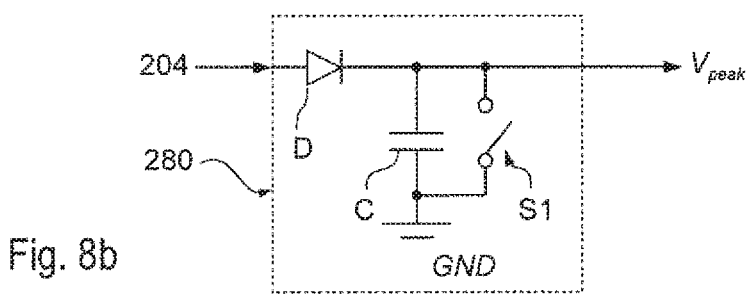

FIG. 8b shows a second embodiment of a peak detector 280. Specifically, an electronic switch S1, such as a transistor, has been added, which is configured to selectively discharge the capacitor C as a function of a control signal. For example, the switch S1 is coupled in parallel with the capacitor C. Accordingly, the switch S1 may be used to reset the peak detector 280.

Figure 8C:
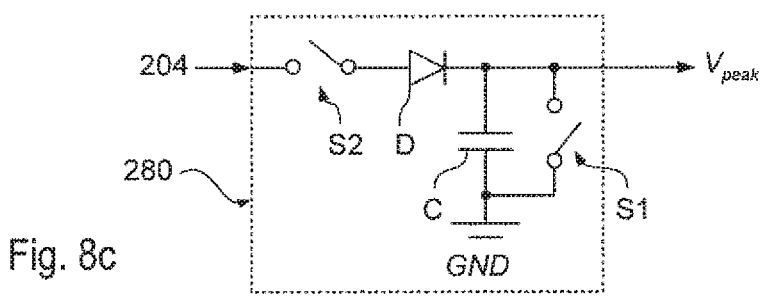

FIG. 8c shows a third embodiment of a peak detector 280. The peak detector 280 comprises an electronic switch S2 configured to selectively enable the peak detector 280 as a function of a control signal. For example, the switch S2 is coupled in series with the diode D, e.g. between the pin 204 and the anode of the diode D or between the cathode of the diode D and the capacitor C. Accordingly, the switch S2 may be used to enable the peak detector 280 also independently of the starting of the oscillation of the LC sensor 10.

Figure 8D:
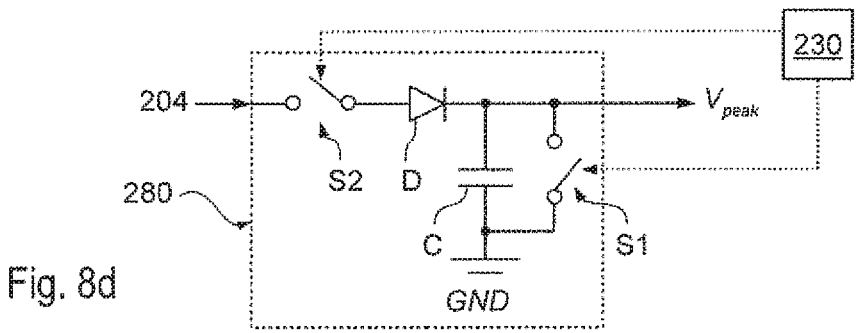

As shown in FIG. 8d, the control signals used to control the switching of the switch S1 and/or S2 may also be provided by the processing unit 230 of the control unit 20.

Figure 8E:
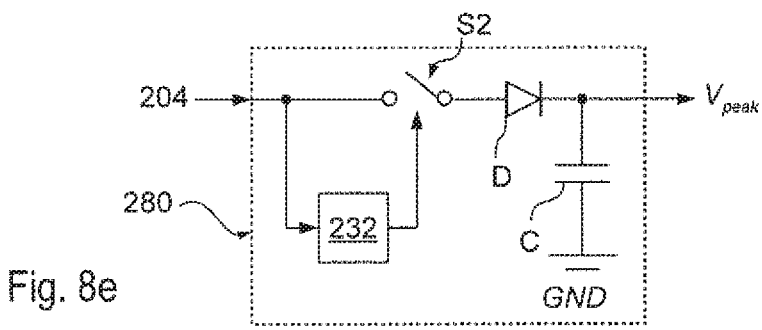

Conversely, FIG. 8e shows an embodiment, wherein at least the switch S2 is controlled by a control circuit 232 being integrated in the peak detector 280. However, the control circuit 232 or at least part of the function of the control circuit 232, may also be integrated in the control unit 20.

For example, the control circuit 232 is configured to determine the control signal for the switch S2 as a function of the signal at the input of the peak detector 280, i.e. the control circuit 232 is configured to enable and/or disable the peak detector 280 as a function of the voltage at the input of the peak detector 280.

Figure 1:
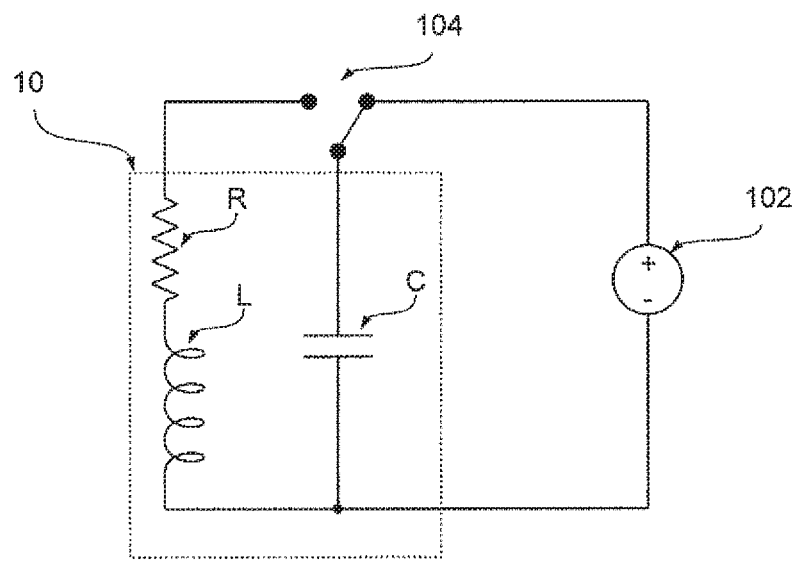
FIG. 1 is a prior art LC sensor.
Figure 2A:
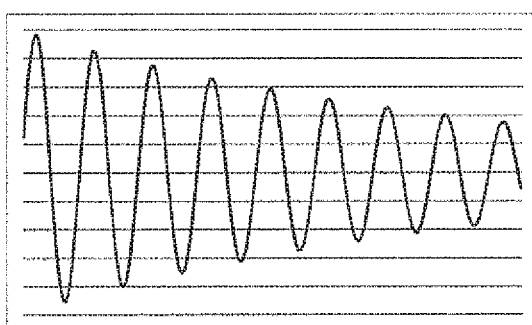
FIGS. 2a and 2b show respectively the oscillations with and without a metallic object in the vicinity of the LC sensor of FIG. 1.
Figure 2B:
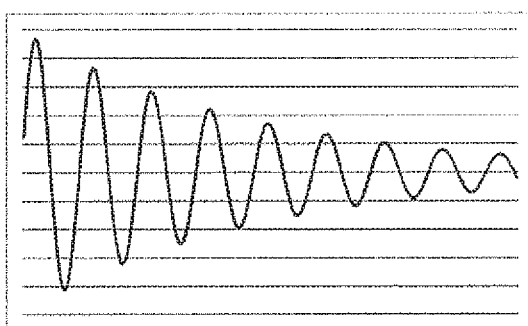
Figure 3A:
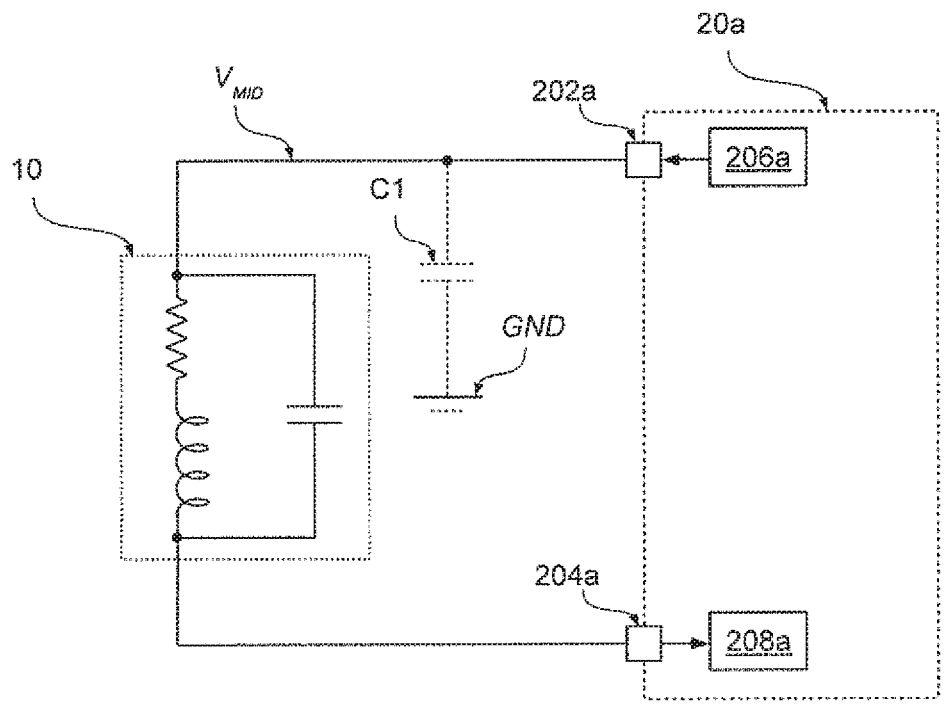
FIG. 3a is a prior art LC sensor and control unit.
Figure 3B:
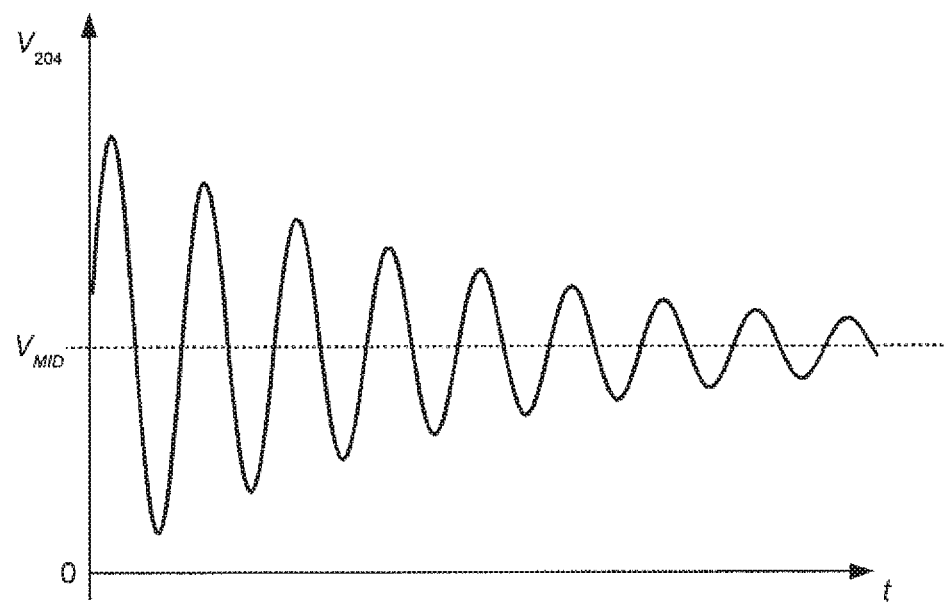
Figure 4:
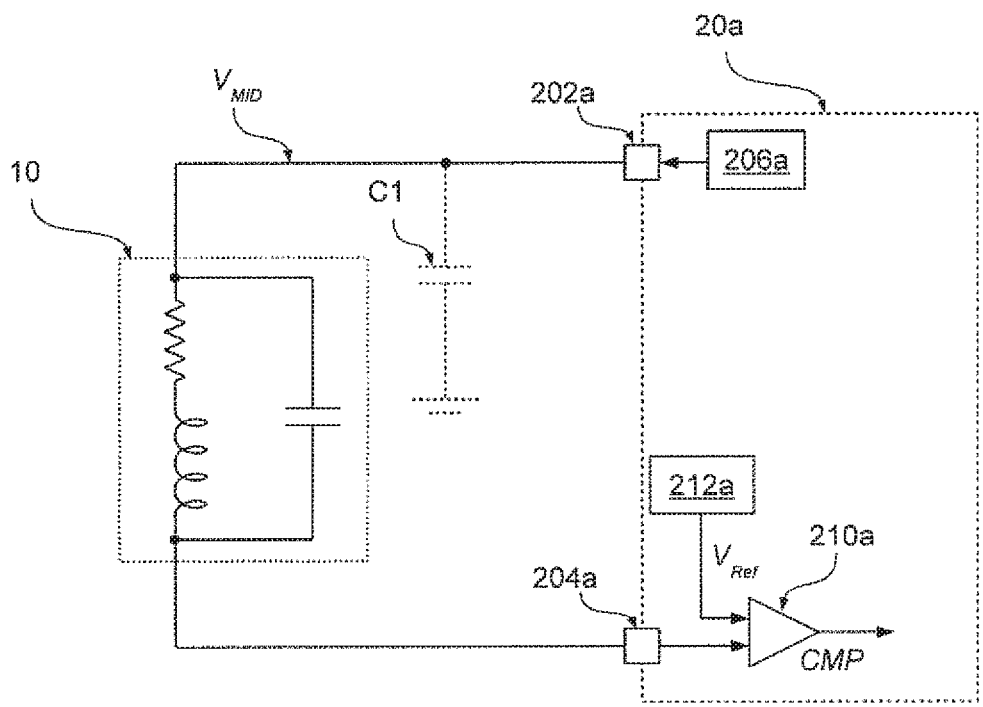
FIG. 4 is the LC sensor of FIG. 3a where the control unit includes a comparator.
Figure 5A:
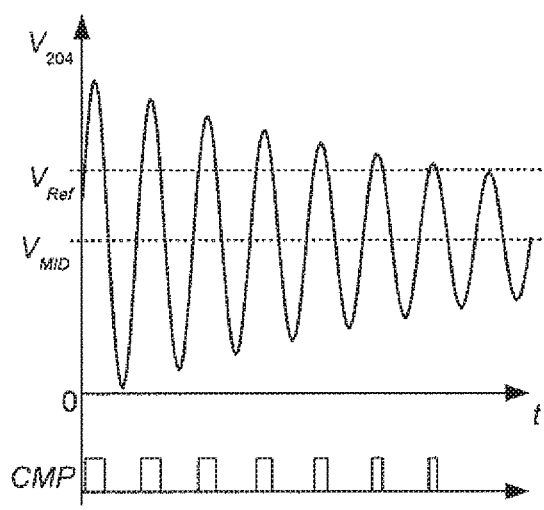
FIGS. 5a and 5b show respectively the oscillations with and without a metallic object in the vicinity of the LC sensor of FIG. 4.
Figure 5B:
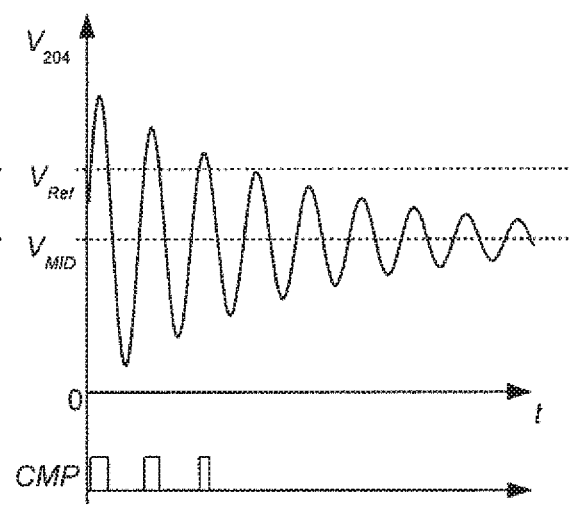

The circuit 232 may comprise one or more comparators configured to compare the input voltage with one or more threshold values. The circuit 232 may be configured to enable the peak detector only at the second peak value of the oscillation. As shown in FIGS. 5a and 5b, a comparator may be used for this purpose, which provides a comparison signal (corresponding more or less to the signal CMP shown in FIGS. 5a and 5b) which indicates whether the voltage at the input of the peak detector 280 is greater than a given threshold. In this case, the peak detector 280 could be enabled during the second pulse in the comparison signal at the output of this comparator. Those of skill in the art will appreciate that a digital circuit may be used for this purpose in order to extract the second impulse from the comparison signal, such as a counter.

Generally, also any other of the pulses in the comparison signal could be used to enable and disable the peak detector 280, such as the first pulse.

Moreover, also other circuits may be used in order to detect the value of a given peak in the oscillation. For example, the circuit 232 could enable the peak detector 280 at a falling edged and disable the peak detector 280 at the next falling edge.

Accordingly, the peak value $V_{peak}$ provided at the output of the peak detector 280 would depend on the initial amplitude of the oscillation and the damping of the oscillation. For example, in this way, the damping behavior may be determined more precisely, even with a low resolution analog-to-digital converter.

Generally, in case an external peak detector 280 is used, two additional pins of the control unit 20 may be required for this purpose. However, a single pin may be used for the control of the switch S2 and the switch S1 may be implemented directly with the driver logic of the control unit 20 associated with the pin receiving the peak signal $V_{peak}$, e.g. the pin 248 shown in FIG. 7a.

Figure 9A:
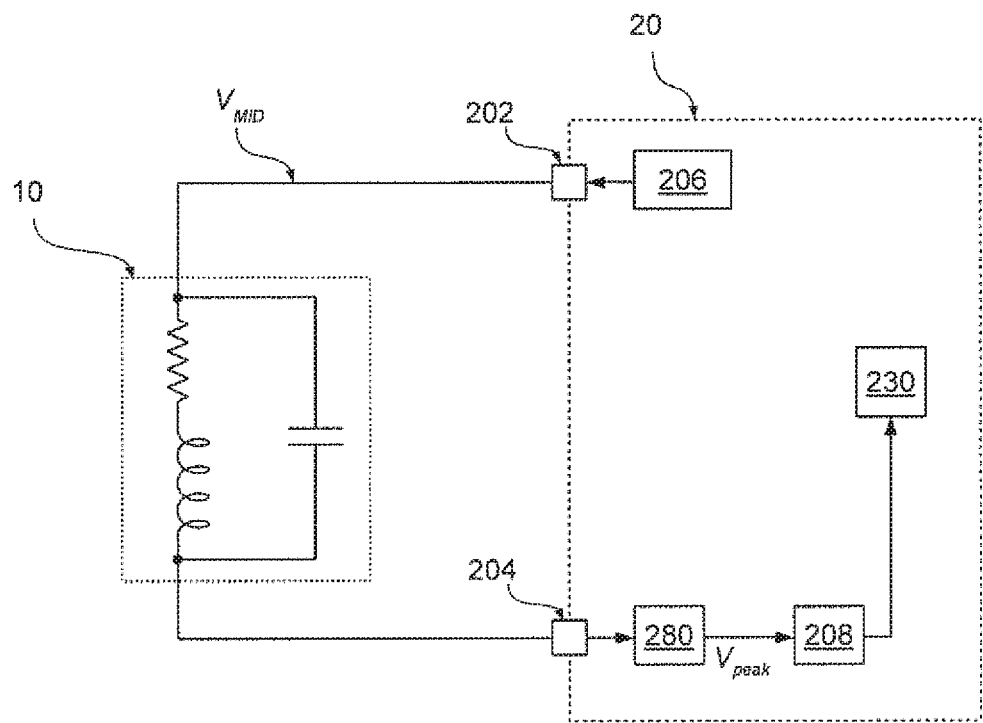
FIGS. 9a and 9b show embodiments of the invention for measuring characteristic data of the oscillation of an LC sensor by a peak detector.
Figure 9B:
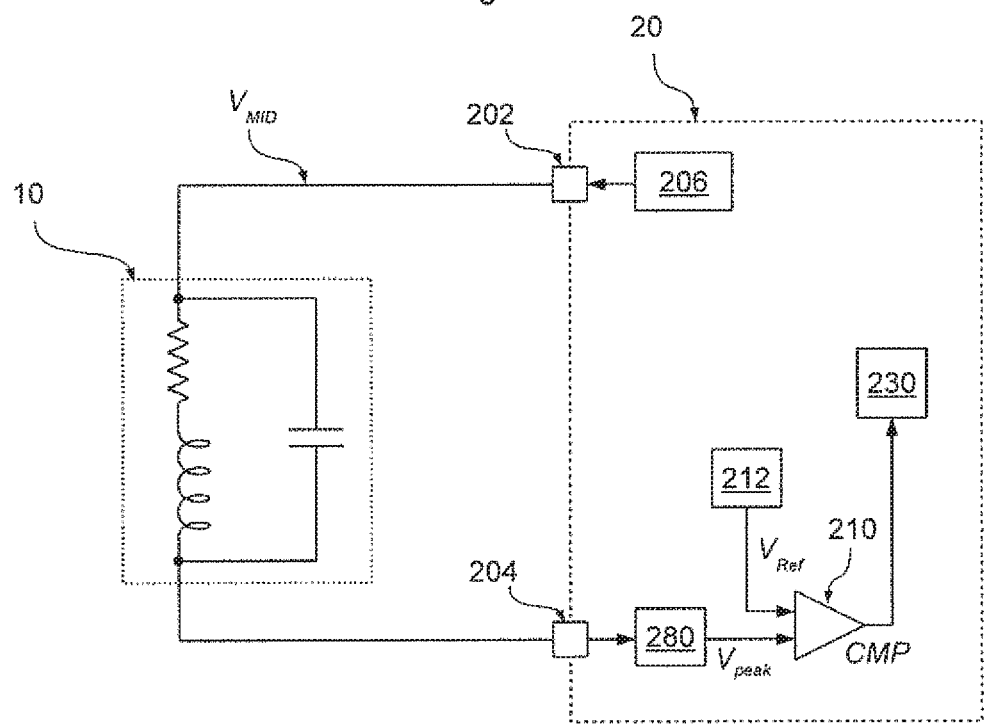

With reference to FIGS. 9a and 9b, the output of the peak detector 280 is coupled to some kind of detection circuit. Generally, the following embodiments of detection circuits are described at the example of an internal peak detector 280 as shown in FIG. 7b. However, the embodiments may also be applied to an external peak detector 280 as shown in FIG. 7a.

Specifically, the peak detector 280 is coupled to an analog-to-digital converter 208 in FIG. 9a and to a comparator 210 in FIG. 9b. In both cases, the signal at the output of the comparator or the analog to digital converter may be provided to the processing unit 230.

Generally, also in this case, the voltage at the pin 204 corresponds to a damped oscillation having a DC offset corresponding to the voltage $V_{MID}$, imposed by the voltage source 206, i.e. the voltage $V_{MID}$ constitutes the middle point of the oscillation.

Thus, the output of the peak detector 280 provides a signal $V_{peak}$ being indicative of the peak value of this oscillation at a given time. For example, by using a peak detector as shown in FIG. 8c, the peak detector 280 may be reset (e.g. by switch S1) and enabled (e.g. by switch S2) at any given time once a given period of time has passed since the oscillation of the sensor has been started.

For example, in the embodiment shown in FIG. 9a, the signal at the output of the peak detector is coupled to an analog-to-digital converter 208. However, while a high-speed ADC may be required in the prior-art approaches, a low speed ADC may be used in this embodiment because the signal at the output of the peak detector remains stable after a given short time period, e.g. the duration of one oscillation of the LC sensor 10.

In the embodiment shown in FIG. 9b, the control unit 20 comprises a comparator 210, which compares the signal $V_{peak}$ at the output of the peak detector 280 with a reference signal, such as a reference voltage $V_{Ref}$. For example, this reference voltage $V_{Ref}$ may be fixed or set via a digital-to-analog converter 212. However, while the number of pulses in the signal was relevant in the prior-art approaches and thus a high speed comparator was required, the comparator of the present disclosure determines whether the peak value $V_{peak}$ exceeds a given threshold value. For example, the use of a comparator might be sufficient in case only the presence or absence of metallic objects in front of the sensor 10 has to be detected.

Generally, also in this case, the control unit may comprise both an analog-to-digital converter 208 and an analog comparator 210. Generally, it is not of particular interest for this embodiment how the oscillation of the LC sensor 10 is started.

Figure 11:
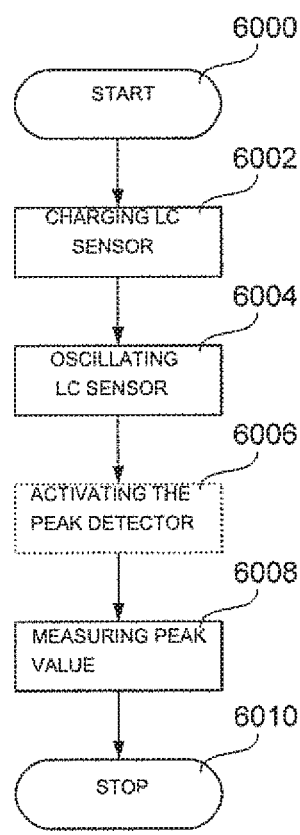
FIG. 11 shows a method for interfacing an LC sensor which may be used in the systems of FIGS. 7a and 7b.

As shown in FIG. 11, a typical measurement cycle comprises four phase. After a start step 6000, the LC sensor 10 is charged at 6002 and, once the charge phase 6002 finished, the LC sensor 10 is free to oscillate during a phase 6004. At step 6006, the control unit 20 may activate the peak detector (see e.g. FIG. 8*d*). Generally, this step is optional and may be performed, e.g., also before the oscillation of the LC sensor 10 is started at step 6002. Next, the control unit measures at step 6008 the peak value $V_{peak}$ provided by the peak detector 280 (see FIGS. 9*a* and 9*b*). Finally, the measurement ends at a stop step 6010.

In order to start the oscillation at step 6002, the previous embodiments were based on use of a fixed voltage generator 206, which imposes the middle point voltage $V_{MID}$ at the pin 202 and wherein a switch 222 is used to connect the pin 204 selectively to ground. However, the approaches described in the Italian patent applications TO2014A00000548 or TO2014A000549, which are incorporated herein by reference, may be used to start the oscillation.

Figure 12:
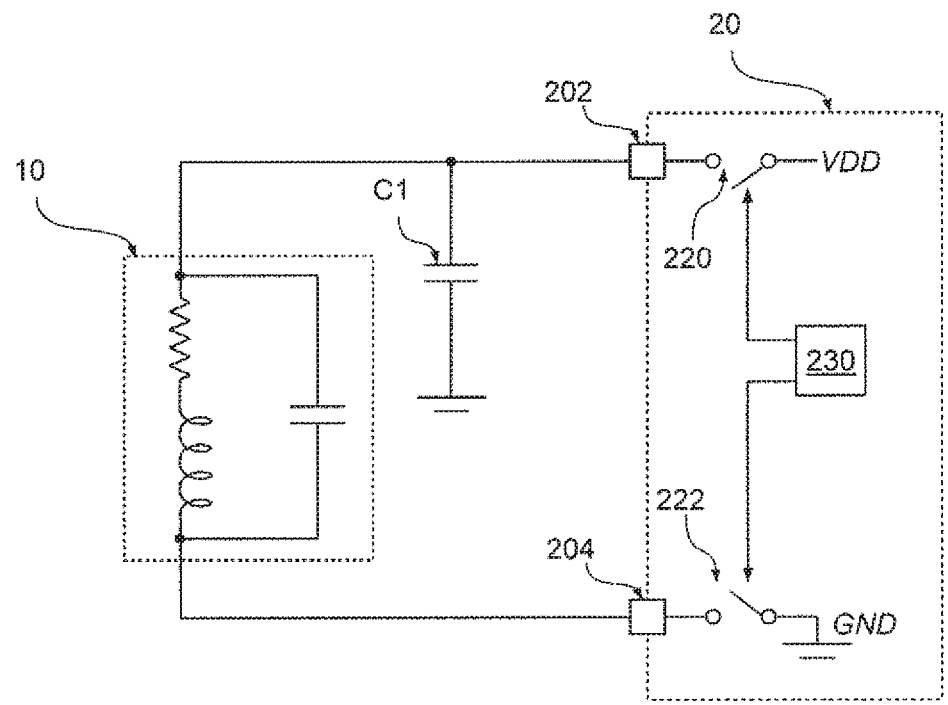
FIGS. 12 and 13 show further embodiments of the invention adapted to start the oscillation of an LC sensor.

For example, FIG. 12 shows briefly the approach proposed in Italian patent application TO2014A000549. Also in this approach, a LC sensor 10 is coupled to a control unit 20 comprising the contacts 202 and 204, wherein the LC sensor 10 is coupled between these two contacts.

However, while a voltage generator 206 imposing a fixed voltage at the pin 202 has been used in the above embodiments, the approach described in Italian patent application TO2014A000549 uses a capacitor which is charged via a supply voltage, such as VDD, to a given voltage. For this purpose, a capacitor C1 is coupled between the contact 202 and a ground GND. Thus, an oscillation of the LC sensor is started by:

during a first phase, connecting the contact 202 to the supply voltage, e.g. VDD, and placing the contact 204 in a high impedance state, such that the capacitor C1 is charged through the supply voltage, e.g. VDD;

during a second phase, placing the contact 202 in a high impedance state and connecting the contact 204 to ground GND, such that the capacitor C1 transfers charge towards the LC sensor 10; and during a third phase, placing the contact 202 and the second contact 204 in a high impedance state, such that the LC sensor 10 is able to oscillate.

Accordingly, the peak detector 280 may be coupled to the pin 204 in order to determine the peak voltage of the oscillation at the pin 204.

Italian patent application TO2014A000548 addresses the problem of clamping circuits, which may be coupled to the pins 202 and/or 204. Specifically, once the oscillation of the LC sensor 10 is started, the voltage $V_{204}$ at the second contact 204 is monitored. Specifically, this voltage corresponds to the sum of the voltage at the contact 202, i.e. the voltage $V_{MID}$, and the voltage at the LC sensor 10. Thus, in order to avoid that the clamping circuit dissipates energy from the LC sensor 10, the voltage at the contact 202 is varied such that the voltage at the measurement contact 204 does not exceed an upper voltage threshold and does not fall below a lower voltage threshold.

Figure 13:
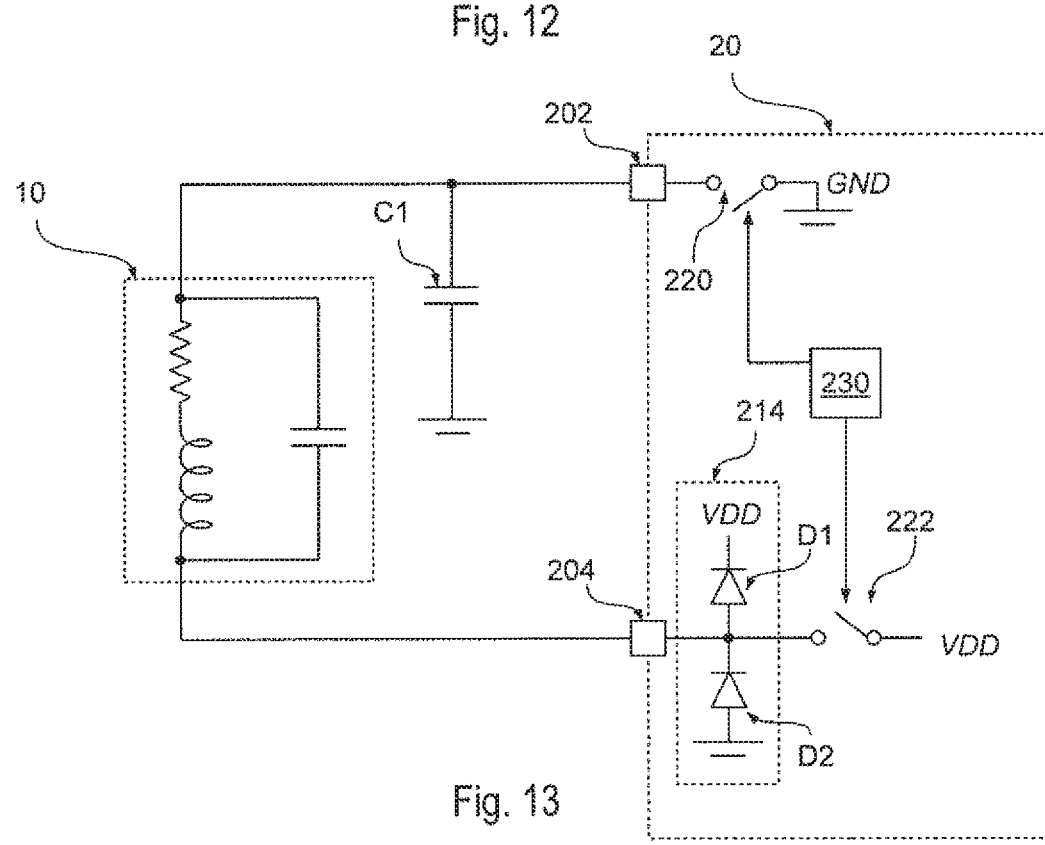

However, Italian patent application TO2014A0000549 describes with respect to FIG. 13, which is reproduced herein as FIG. 13, a different approach for starting the oscillation of the LC sensor 10.

Specifically, a capacitor C1 is coupled between the contact 202 and ground GND. However, the oscillation may be started in two different ways.

In the first case, the oscillation is started by:

during a first phase, coupling the contact 202 to ground GND, such that said capacitor C1 is discharged;

during a second phase, coupling the contact 202 to ground GND and coupling the contact 204 to a supply voltage, e.g. VDD, such that the LC sensor 10 is charged; and during a third phase, placing the contact 202 and the contact 204 in a high impedance state, such that the LC sensor 10 is able to oscillate.

Accordingly, the capacitor C1 is initially discharged when the LC sensor starts to oscillate, but the voltage at the contact 204 is limited by charging or discharging the capacitor C1 through the clamping circuit 214 of the contact 204.

Conversely, in the second case, the oscillation is started by:

during a first phase, coupling the contact 202 to a supply voltage, e.g. VDD, such that the capacitor C1 is charged;

during a second phase, coupling the contact 202 to the supply voltage and coupling the contact 204 to ground GND, such that the LC sensor 10 is charged; and during a third phase, placing the contact 202 and the contact 204 in a high impedance state, such that the LC sensor 10 is able to oscillate.

Accordingly, the capacitor C1 is initially charged when the LC sensor starts to oscillate, but the oscillation occurs in the opposite direction. Thus, the voltage at the contact 204 is limited by discharging or charging the capacitor C1 through the clamping circuit 214 of the contact 204. However, again a peak detector 280 may be used to determine the peak value of the oscillation at the pin 204.

Generally, in order to interface a LC sensor with a control unit by a peak voltage detector 280, the possible presence of clamping diodes used to protect I/O pads may cause a problem. Indeed, as described in Italian patent application TO2014A000549, these diodes would limit the amplitude of the oscillation at the pin 204, and thus prevent a significant measurement of the peak voltage.

For this reason, the arrangements using a voltage source 206 (as described with respect to FIGS. 6*a* and 6*b*) and the approach described in Italian patent application TO2014A000549 (as shown in FIG. 12) usually use a middle point voltage $V_{MID}$ corresponding (during the oscillation of the LC sensor) at most to VDD/2. Thus, the peak value of the oscillation at the measurement pin 204 is usually below the supply voltage VDD of the control unit 20.

Conversely, this is usually not the case in the arrangement of Italian patent application TO2014A000548. Accordingly, the peak detector 280 shown in FIG. 8*a* would be charged to the value of the supply voltage VDD, rending the detection meaningless. However, in this case the peak detector of FIG. 8*c* could be used and which is enabled after a given period of time.

Instead, a different approach is used to avoid excessive voltages at the measurement pin 204. Specifically, in order to cope with this saturation issue and to avoid the use of a dedicated middle point generator 206 (as shown in FIGS. 6*a* and 6*b*), a capacitor voltage divider is used.

Figure 14A:
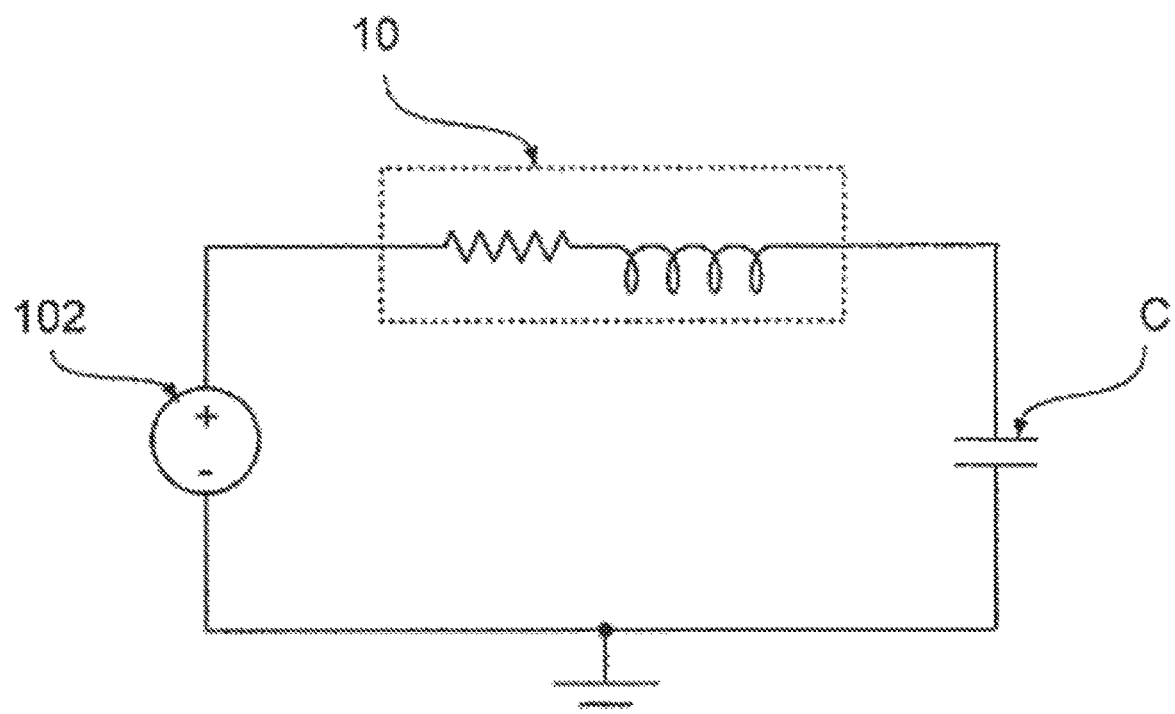
FIGS. 14a and 14b show the general operation of an RLC resonant circuit.

FIG. 14*a* shows in this respect the model of a RLC series resonant circuit, comprising a LC sensor 10 coupled in series with a capacitor C to a voltage source 102.

Generally, neglecting the internal capacitor of the LC sensor 10, the natural frequency $f_0$ of the RLC resonant circuit may be determined from the following relation:

$$\omega_0 = 2\pi f_0 = \frac{1}{\sqrt{LC}} \tag{1}$$

Conversely, the damping factor $\xi$ is:

$$\xi = \frac{R}{2}\sqrt{\frac{C}{L}} \quad (2)$$

Finally, the overshoot OS:

$$OS = e^{\frac{-\pi\xi}{\sqrt{1-\xi^2}}} \quad (3)$$

is directly linked to the peak voltage Vpeak:

$$V_{peak} = V_{final}(1+OS) \quad (4)$$

According to these equations, the peak voltage $V_{peak}$ at the capacitor C cannot exceed the double of the final voltage $V_{final}$, i.e. the voltage applied to the RLC series, which corresponds usually to the voltage $V_{MID}$.

Thus, in order to perform LC sensor measurement through the peak voltage approach, while avoiding a dedicated voltage generator 206, a capacitor voltage divider may be used.

In fact, the voltage generator 206 described with respect to FIGS. 6a and 6b usually provides a voltage, which corresponds at most to VDD/2. Thus, a circuit would be required in order to generate this voltage staring from the supply voltage VDD.

Conversely, when using a capacitive voltage divider, the voltage provided at the pin 202 may also be higher, and in particular may correspond to the supply voltage VDD.

Figure 14B:
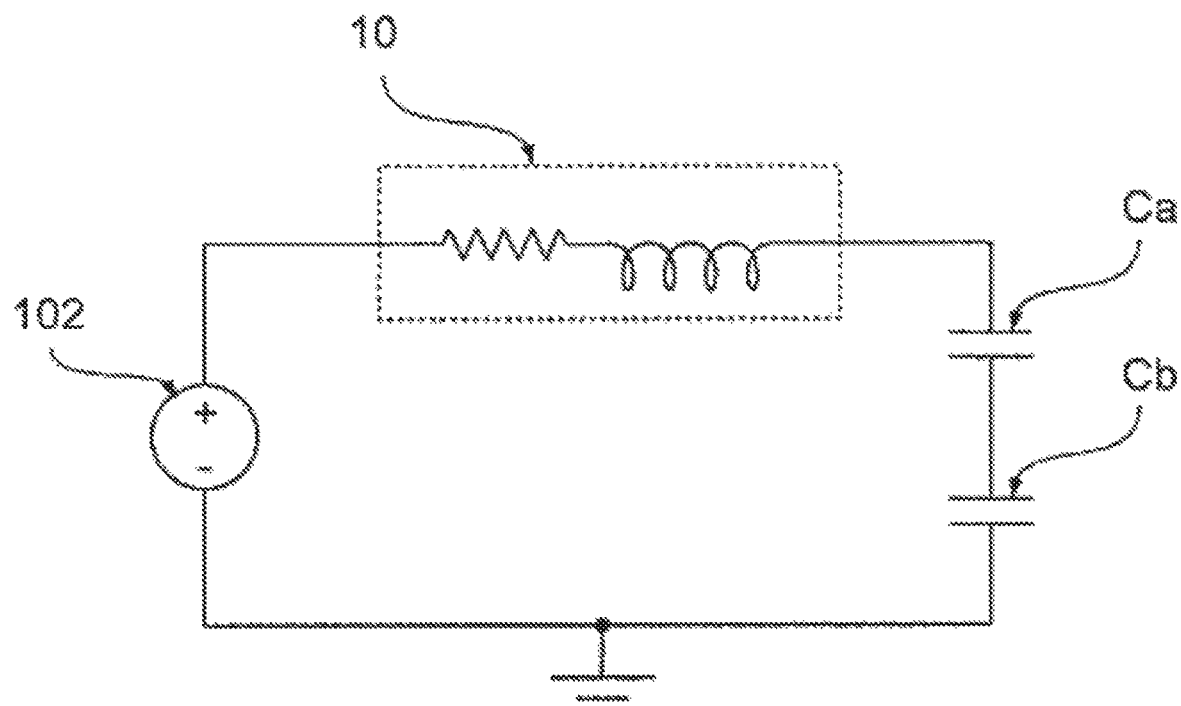

FIG. 14b shows an example, wherein the capacitor of FIG. 14a has been split in two capacitors Ca and Cb coupled in series. Thus, assuming that these capacitors have equal values, i.e. Ca=Cb, the peak voltage at the capacitor Cb would correspond to:

$$V_{peak} = V_{final}(1+OS)/2 \quad (5)$$

Figure 15:
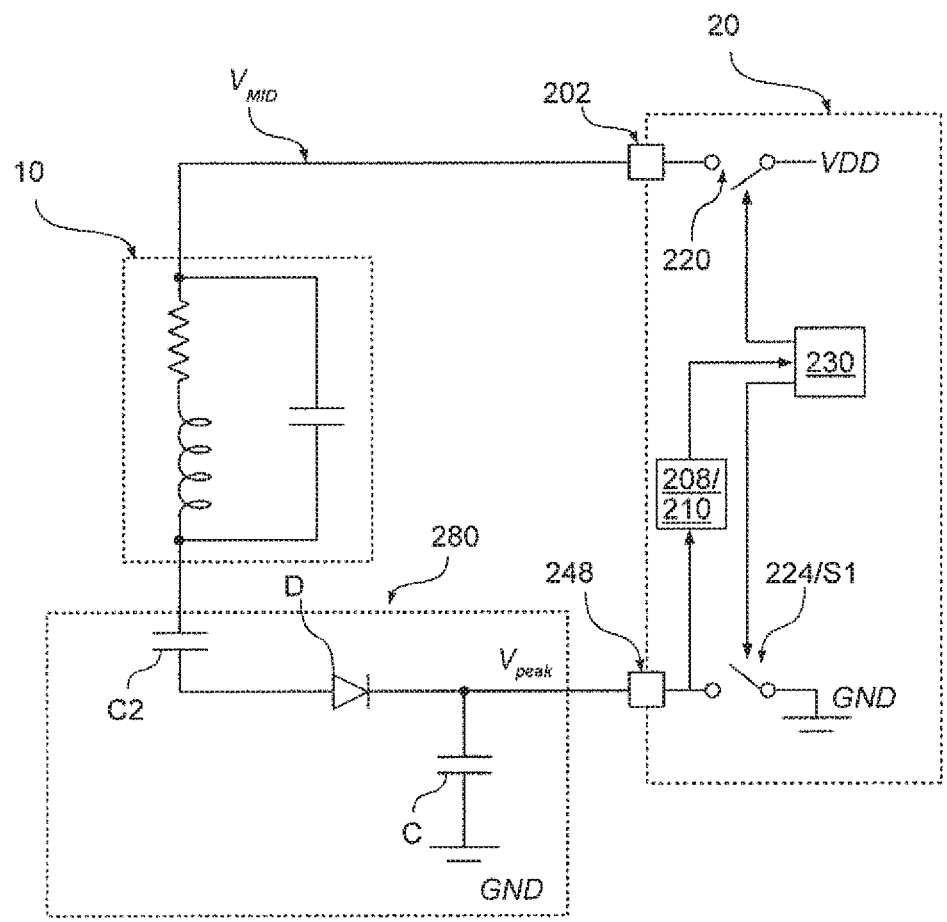
FIGS. 15 and 16 show further embodiments of the invention for interfacing an LC sensor by a peak detector.

Thus, by using a peak detector 280 comprising a capacitive voltage divider, the embodiments disclosed with respect to FIGS. 6a and 6b may be modified, e.g., as shown in FIG. 15.

Figure 16:
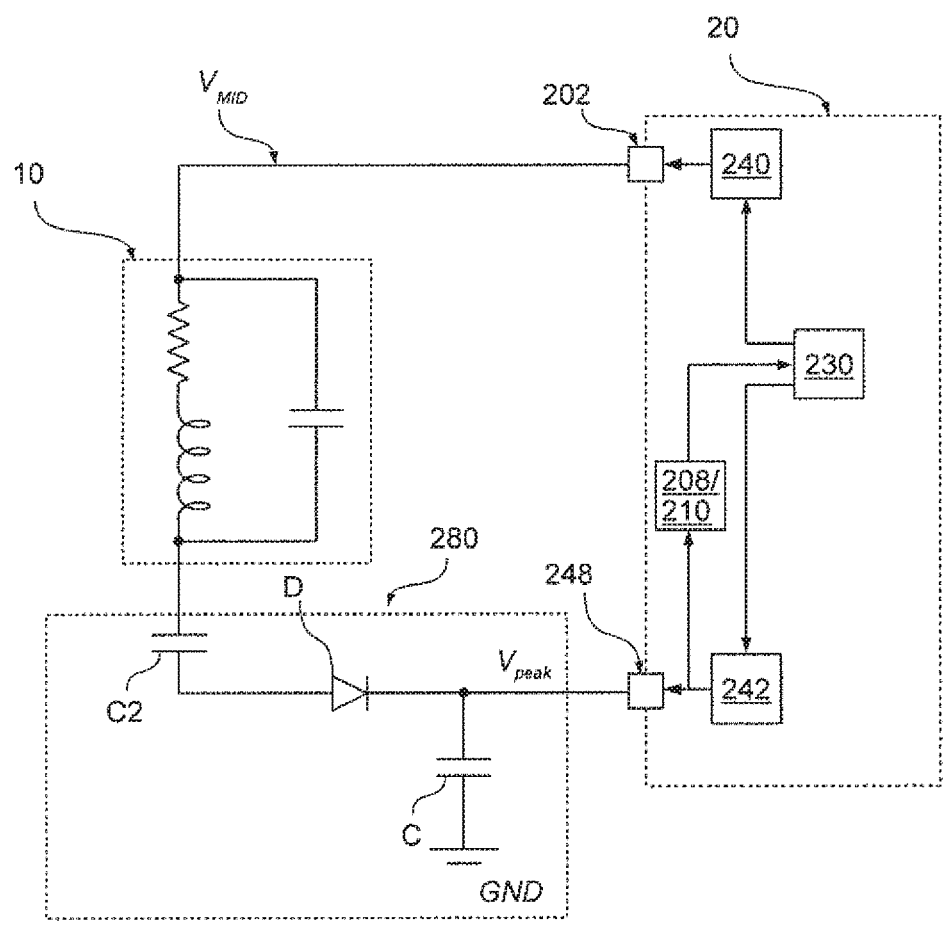

Specifically, the voltage generator 206 is replaced with a simple switch 220 configured to couple the pin 202 selectively to VDD. For example, as shown in FIG. 16, a conventional two state or three state driver logic 240 of an output pin of a microcontroller may be used for this purpose, wherein the processing unit 230 may set the pin 202 to the voltage VDD, e.g. by driving the driver logic 240 with the logic value "1".

The LC sensor 10 is coupled (e.g. directly) in series with a peak detector 280 between the pin 202 and ground GND. Specifically, the peak detector 280 comprises a diode D and two capacitors C and C2. Consequently, the LC sensor 10, the capacitor C2, the diode D and the capacitor C are coupled in series between the pin 202 and ground GND. In particular, due to the voltage at the pin 202 is switched, the previous pin 204 may not be required and the connection to ground GND may be fixed.

Those of skill in the art will appreciate that the position of the capacitor C2 may also change and, instead of coupling the capacitor between the LC sensor 10 and the diode D, the capacitor C2 may be coupled also, e.g., between the diode D and the capacitor C.

Accordingly, when the pin 202 is coupled to VDD via the switch 220 (or the driver logic 240), the oscillation of the LC sensor will start with an overshoot and the capacitor C will be charged to a peak value depending on the ratio between the capacitances of the capacitor C2 and C. For example, usually the capacitances of the capacitors C2 and C should substantially be the same. For example, usually capacitances in the range of 200-2000 pF may be used.

The voltage $V_{peak}$ at the capacitor C is provided to the control unit 20, e.g. the pin 248. Accordingly, by monitoring the voltage at the pin 248, e.g. by an analog-to-digital converter 208 (see also FIG. 9a) and/or a comparator 210 (see also FIG. 9b) the processing unit 230 is able to determine the state of the LC sensor 10.

A switch S2 may be used for discharging the capacitor C. For example, as shown with respect to FIGS. 8b-8d, this switch may be incorporated in the peak detector 280. Conversely, a switch 224 coupled to the pin 248 may be used for this purpose. Specifically, when the switch 224 is closed, the capacitor C will be coupled to ground GND, thereby discharging the capacitor C. For example, as shown in FIG. 16, such a switch 224 may be implemented with a conventional three state driver logic 260 of the pin 248.

Similarly, the capacitor C2 and the LC sensor 10 may be discharged by coupling contemporaneously the pin 202 to ground, e.g. by using the driver logic 240.

Accordingly, as shown in FIG. 16, by providing two additional capacitors C and C2 and a diode D, a conventional microcontroller (or any other integrated circuit) may be used as control unit 20. Specifically, the control unit 20 should comprise at least two pins: an excitation pin 202 and a measurement pins 248, wherein at least the pin 202 has associated a two or three state driver circuit for connecting the pin 202 selectively to the supply voltage VDD, thereby starting the oscillation of the LC sensor. Conversely, the second pin 248 provides the peak voltage and may be fed to an internal comparator 210 or analog-to-digital converter 208 for determining the peak voltage. Finally, the measurement pin 248 may also have associated a respective three state driver circuit 260 for selectively discharging the capacitor C.

For example, typically a 10 or 12 bit analog-to-digital converter 208 is sufficient in order to determine the voltage variation of the peak value being caused by variations of the resistance R of the LC sensor 10 of several Ohms.

Generally, the peak detector 280 described with respect to FIGS. 15 and 16 could also be used in the previous embodiments. Moreover, also in the embodiment shown in FIG. 6b, the pin 204 may not be required by connecting the LC sensor 10 via a peak detector 280 to ground.

The approaches described herein are also particularly suitable for managing multiple LC sensors. In fact, depending on the application requirements, different arrangements may be used in order to interface a number of N LC sensors:

sequential measurement (see FIG. 17a), wherein a respective excitation pin 202 is provided for each LC sensor 10 and wherein the LC sensors are coupled to the same peak detector 280 providing the peak value to a single measurement pin 248, i.e., N excitation pins 202, one peak detector 280 and one measurement pin 248;

parallel measurement (see FIG. 17b), wherein a single excitation pin 202 is provided for all LC sensors 10 and wherein the LC sensors are coupled to respective peak detectors 280 providing the respective peak values to respective measurement pins 248, i.e., one excitation pins 202, N peak detectors 280 and N measurement pins;

independent measurement (see FIG. 17c), wherein a respective excitation pin 202 is provided for each LC sensor 10 and wherein the LC sensors 10 are coupled to respective peak detectors 280 providing the respective peak values to respective measurement pins 248, i.e., N excitation pins 202, N peak detectors 280 and N measurement pins.

Independently of the specific architecture adopted (sequential, parallel or independent measurement), the approach described herein may use a single analog to digital converter 208 (or alternatively a single comparator 210). Due to the peak values stored by the associated peak detector 280, the peak values coming from different measurement pins 248 may be provided sequentially to the same measurement circuit 208/210 without losing information.

Figure 17A:
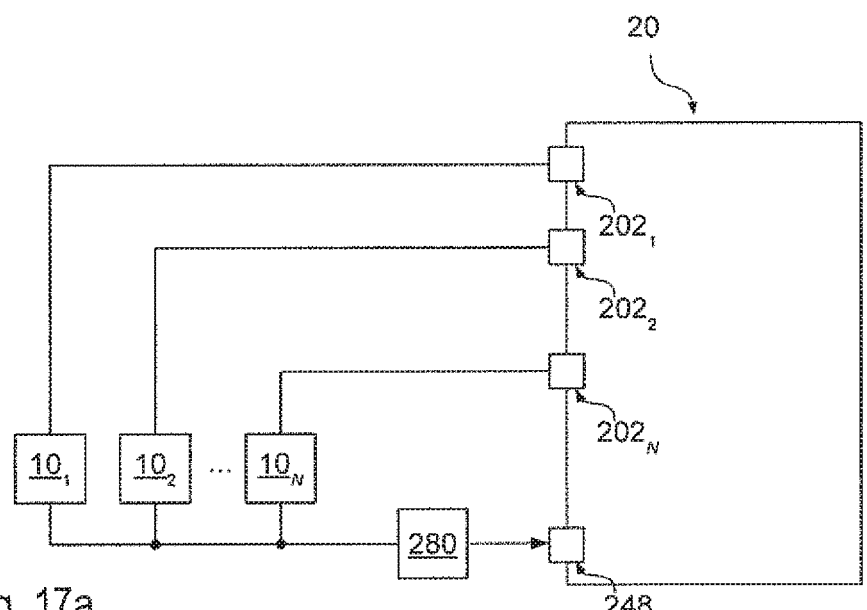
FIGS. 17a to 17c show embodiments of the invention for interfacing a plurality of LC sensors.
Figure 17B:
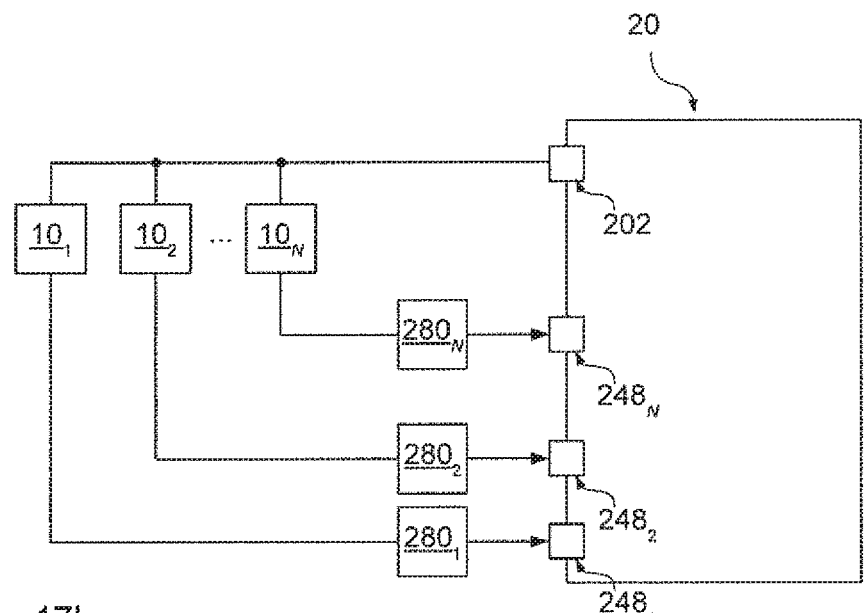
Figure 17C:
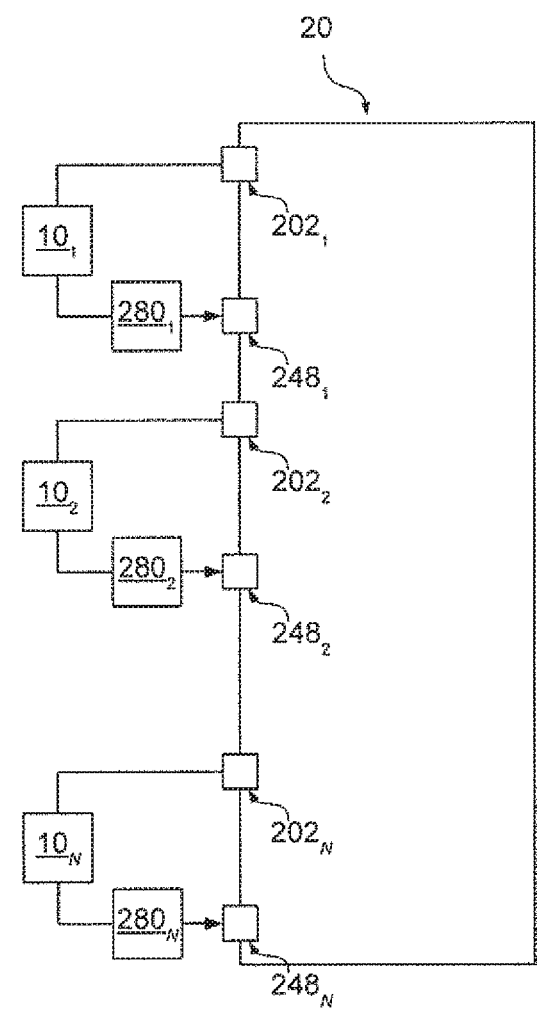
Figure 18:
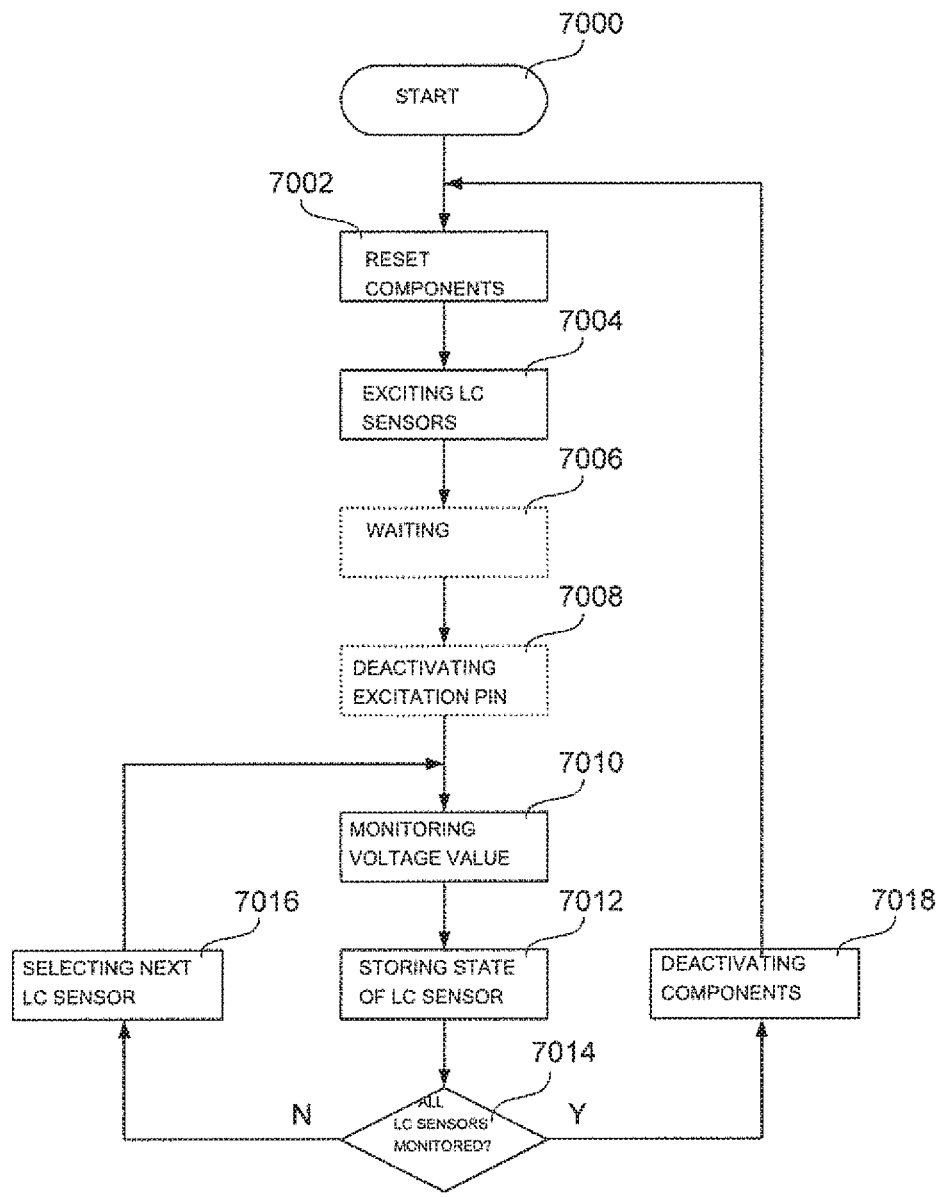
FIG. 18 shows a method for interfacing a plurality of LC sensors which may be used in the systems of FIGS. 15 and 16.

FIG. 18 shows in this respect a possible measurement procedure, which may be used for the parallel (see FIG. 17b) or independent measurement (see FIG. 17c).

After a start step 7000, the control unit 20 resets at step 7002 all external components. For example, this may include discharging the capacitor C of the peak detector and the LC sensor 10. Usually the excitation pin(s) 202 and the measurement pins 248 are coupled to ground for this purpose. The processing unit 230 may drive the driver circuits 240 and 242 associated with the pins 202 and 248 with the logic value "0".

At step 7004, the control unit 20 excites all LC sensors 10 by placing the measurement pin 248 in a high impedance state and by connecting the excitation pin(s) 202 to the supply voltage VDD. For example, the processing unit 230 may drive the driver circuits 240 associated with the pin(s) 202 with the logic value "1" and the driver circuits 242 associated with the pins 248 with the logic value "Z".

At step 7010, the control unit may monitor the value of the voltage at the measurement pin 248 associated with the current LC sensor. For example, the control unit 20 may determine the state of the current LC sensor by measuring by an analog-to-digital converter 208 the voltage at the current measurement pin 248 and comparing the digital peak value with a digital reference value, or the control unit 20 may compare the voltage via an analog comparator 210 directly with at least one analog threshold value $V_{Ref}$.

At step 7012 the control unit 20 stores the state of the current LC sensor 10.

Next, at step 7014 the control unit 20 may test whether all LC sensors 10 have been monitored.

In case at least one LC sensor 10 has not been monitored (output "N" of the verification step 7014), the control unit 20 selects at step 7016 the next LC sensor and the procedure is repeated at step 7010.

Otherwise, in case all LC sensors 10 have been monitored (output "Y" of the verification step 7014), the control unit 20 proceeds to step 7018 in which the control unit waits till a next measurement is requested, before the procedure returns at step 7002.

As shown in FIG. 18, the procedure may also comprise two further optional steps 7006 and/or 7008, which could also be introduced in the method described with respect to FIG. 11 for a single sensor.

Specifically, the step 7006 may be a wait step, in which the control unit 20 waits a given period of time, corresponding at least to one fourth of the oscillation period of the LC sensor 10. In fact, this period may be required in order to ensure that the overshoot occurred and the peak detector 280 stored the peak value.

Conversely, the step 7008 may be used to deactivate the excitation pin 202 and/or activate the analog-to-digital converter 208 (or alternatively the comparator 210), thereby reducing the power consumption. These measurement components may then be deactivated again, e.g., at the step 7018.

The proposed peak detectors 280 may also be modified to reduce the number of required off-chip components. Generally, the diode D may be easily integrated on-chip with the control unit 20. Conversely, at least the capacitor C is usually too big to be integrated. In fact, a small capacitor C (with respect to C2) could lead to the saturation problem, while reducing both capacitors C and C2 could lead to poor resolution. Thus, a possible approach, which may be suitable at least for the approaches using a single peak detector (e.g. single sensor or sequential measurement) may be the use of an integrated diode and external capacitors.

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A method for determining a state of an LC sensor, the method comprising:
   exciting the LC sensor by providing a predetermined voltage to a first terminal, the first terminal being coupled to the LC sensor;
   enabling a peak detector at a first falling edge of an oscillation of the LC sensor;
   detecting a peak voltage of an overshoot of oscillation of the LC sensor at a second terminal using the peak detector, the second terminal being coupled to the LC sensor;
   disabling the peak detector at a second falling edge of the oscillation of the LC sensor, the second falling edge being immediate after the first falling edge; and
   determining the state of the LC sensor based on the peak voltage.

2. The method of claim 1, further comprising stopping exciting the LC sensor a first time after exciting the LC sensor, wherein the first time corresponds to at least one fourth of an oscillation period of the LC sensor.

3. The method of claim 1, further comprising:
   after exciting the LC sensor, exciting a second LC sensor by providing the predetermined voltage to a third terminal, the third terminal being coupled to the second LC sensor;
   detecting a second peak voltage of an overshoot of an oscillation of the second LC sensor at the second terminal, the second terminal being further coupled to the second LC sensor; and
   determining the state of the second LC sensor based on the second peak voltage.

4. The method of claim 1, further comprising:
   exciting a second LC sensor by providing the predetermined voltage to the first terminal, the first terminal being further coupled to the second LC sensor;
   detecting a second peak voltage of an overshoot of an oscillation of the second LC sensor at a third terminal, the third terminal being coupled to the second LC sensor; and
   determining the state of the second LC sensor based on the second peak voltage.

5. The method of claim 4, wherein determining the state of the LC sensor and determining the state of the second LC sensor occur in parallel.

6. The method of claim 1, further comprising:
   exciting a second LC sensor by providing the predetermined voltage to a third terminal, the third terminal being coupled to the second LC sensor;

detecting a second peak voltage of an overshoot of an oscillation of the second LC sensor at a fourth terminal, the fourth terminal being coupled to the second LC sensor; and determining the state of the second LC sensor based on the second peak voltage.

7. The method of claim 1, wherein the peak detector comprises:
a first capacitor having a first capacitance and a first terminal coupled to a first terminal of the LC sensor;
a diode having an anode coupled to a second terminal of the first capacitor; and
a second capacitor having a second capacitance and coupled to a cathode of the diode, wherein the second capacitance is substantially equal to the first capacitance.

8. The method of claim 1, wherein the peak detector comprises:
a first switch having a first terminal coupled to a first terminal of the LC sensor;
a diode having an anode coupled to a second terminal of the first switch; and
a first capacitor coupled to a cathode of the diode.

9. A system comprising:
a circuit having first and second terminals;
an LC sensor having a first terminal coupled to the first terminal of the circuit;
a first capacitor coupled to a second terminal of the LC sensor;
a diode having an anode coupled to the first capacitor and a cathode coupled to the second terminal of the circuit; and
a second capacitor coupled between the cathode of the diode and a reference terminal, wherein the circuit is configured to:
excite the LC sensor by providing a voltage to the first terminal of the circuit,
detect a peak voltage of an overshoot of an oscillation of the LC sensor at the second terminal of the circuit, and
determine a state of the LC sensor based on the peak voltage of the overshoot, wherein the first capacitor has a first capacitance, and the second capacitor has a second capacitance substantially equal to the first capacitance.

10. The system of claim 9, wherein the first capacitor has a capacitance in a range between 200 pF and 2000 pF.

11. The system of claim 9, wherein the circuit comprises an analog-to-digital converter (ADC) coupled to the second terminal of the circuit, and wherein the circuit is configured to detect the state of the LC sensor using the ADC.

12. The system of claim 11, wherein the ADC is a 10-bit ADC or a 12-bit ADC.

13. The system of claim 9, further comprising a peak detector configured to detect the peak voltage of the overshoot of the oscillation of the LC sensor, wherein the circuit is further configured to enable the peak detector at a second peak value of the oscillation of the LC sensor.

14. A system comprising:
a plurality of terminals configured to be coupled to a plurality of LC sensors;
a first peak detector; and
a control circuit configured to:
excite each LC sensor by providing a predetermined voltage to one or more of the plurality of terminal,
enable the first peak detector at a first falling edge of an oscillation of a first LC sensor of the plurality of LC sensors;
detect respective peak voltages of respective overshoots of a respective oscillation of each LC sensor, wherein the first peak detector is configured to detect at least a peak voltage of the oscillation of the first LC sensor,
disable the first peak detector at a second falling edge of the oscillation of the first LC sensor, the second falling edge being immediate after the first falling edge; and
determine a state of each LC sensor based on the respective peak voltage.

15. The system of claim 14, wherein the plurality of terminals comprises a plurality of first terminals and a second terminal, wherein each first terminal of the plurality of first terminals is configured to be coupled to a corresponding first terminal of each LC sensor of the plurality of LC sensors, wherein the second terminal is configured to be coupled to a second terminal of each LC sensor of the plurality of LC sensors, and wherein the control circuit is configured to excite each LC sensor by sequentially applying the predetermined voltage to each first terminal of the plurality of first terminals.

16. The system of claim 14, wherein the plurality of terminals comprises a first terminal and a plurality of second terminals, wherein each second terminal of the plurality of second terminals is configured to be coupled to a corresponding second terminal of each LC sensor of the plurality of LC sensors, wherein the first terminal is configured to be coupled to a first terminal of each LC sensor of the plurality of LC sensors, and wherein the control circuit is configured to excite each LC sensor in parallel by applying the predetermined voltage to the first terminal.

17. The system of claim 16, further comprising a plurality of peak detectors, the plurality of peak detectors comprising the first peak detector, each peak detector coupled to a corresponding second terminal of the plurality of second terminals, wherein each peak detector is configured to detect the respective peak voltage in parallel.

18. The system of claim 14, wherein the plurality of terminals comprises a plurality of first terminal and a plurality of second terminals, wherein each first terminal of the plurality of first terminals is configured to be coupled to a corresponding first terminal of each LC sensor of the plurality of LC sensors, and wherein each second terminal of the plurality of second terminals is configured to be coupled to a corresponding second terminal of each LC sensor of the plurality of LC sensors.

19. The system of claim 14, further comprising the plurality of LC sensors.

20. The system of claim 14, wherein the first peak detector comprises:
a first capacitor having a first capacitance and a first terminal coupled to a first terminal of the first LC sensor;
a diode having an anode coupled to a second terminal of the first capacitor; and
a second capacitor having a second capacitance and coupled to a cathode of the diode, wherein the second capacitance is substantially equal to the first capacitance.

* * * * *